United States Patent
Rea et al.

(10) Patent No.: US 7,421,356 B2
(45) Date of Patent: Sep. 2, 2008

(54) METHOD AND APPARATUS FOR MEASUREMENT OF FUEL CELL HIGH FREQUENCY RESISTANCE IN THE PRESENCE OF LARGE UNDESIRABLE SIGNALS

(75) Inventors: David Rea, Pittsford, NY (US); Kenneth L. Kaye, Fairport, NY (US); Robert S. Foley, Rochester, NY (US); Michael F. Zawisa, Victor, NY (US); Clark G. Hochgraf, Rochester, NY (US)

(73) Assignee: GM Global Technology Operations, Inc., Detroit, MI (US)

( * ) Notice: Subject to any disclaimer, the term of this patent is extended or adjusted under 35 U.S.C. 154(b) by 0 days.

(21) Appl. No.: 11/536,723

(22) Filed: Sep. 29, 2006

(65) Prior Publication Data

US 2008/0091367 A1 Apr. 17, 2008

(51) Int. Cl.
  *G01R 27/00* (2006.01)
  *G01R 23/00* (2006.01)
  *G01R 23/16* (2006.01)
(52) U.S. Cl. .............................. 702/76; 702/65; 702/75
(58) Field of Classification Search .................. 702/64, 702/65, 75, 76; 324/427, 430
See application file for complete search history.

(56) References Cited

U.S. PATENT DOCUMENTS

| | | | |
|---|---|---|---|
| 6,794,844 B2 * | 9/2004 | Hochgraf et al. | 320/101 |
| 6,816,797 B2 * | 11/2004 | Freeman et al. | 702/65 |
| 6,849,352 B2 * | 2/2005 | Formanski et al. | 429/17 |

* cited by examiner

*Primary Examiner*—Michael P Nghiem

(57) ABSTRACT

A method and apparatus for a high frequency resistance measurement instrument with a reasonable dynamic range, which militates against saturation in the presence of one or more large undesirable signals, the high frequency measurement instrument capable of employing multiple alternating currents of differing frequencies to maintain measurement capability despite signal chain saturation in the presence of a large undesirable signal.

11 Claims, 5 Drawing Sheets

METHOD AND APPARATUS FOR MEASUREMENT OF FUEL CELL HIGH FREQUENCY RESISTANCE IN THE PRESENCE OF LARGE UNDESIRABLE SIGNALS

FIELD OF THE INVENTION

This invention relates to a method of operating parameter measurement within a fuel cell system. More particularly, the invention is directed to a method and apparatus for measurement of fuel cell high frequency resistance.

BACKGROUND SUMMARY

High frequency resistance is a well-known and extensively documented property of fuel cells. By measuring the high frequency resistance of a fuel cell within a specific band of excitation current frequencies, the state-of-humidification of a proton exchange membrane can be measured. The high frequency resistance in a proton exchange membrane of the fuel cell is typically measured at a single frequency between 500 Hz and 1500 Hz.

Traditional methods for measuring high frequency resistance begin by first inducing an alternating current at the frequency of interest (typically 1000 Hz) through the fuel cell or stack. Next, the instrument measures the actual current ripple flowing through the fuel cell or stack and the voltage ripple induced on the cell or stack via the injected alternating current. These signals are filtered and amplified by the instrument. The instrument then determines the high frequency resistance by dividing the magnitude of the voltage ripple waveform by the magnitude of the current ripple waveform. In accordance with Ohm's law, the resulting value is a resistance, which may be further scaled by the number of cells in the stack or the active area of the fuel cell membrane to yield the unit-area-resistance of the membrane.

In noisy electrical environments, such as that of a high voltage distribution system in an electrically-propelled vehicle, other large alternating current ripples may be present in addition to the induced ripple current and resultant ripple voltage. These large undesirable signals may exist at a single frequency persistently, or they may have variable frequency content depending on vehicle speed, engine load, or other factors.

The presence of such large undesirable signals can be problematic for traditional single-frequency high frequency resistance measurement systems. For example, if the induced ripple current is approximately 0.3 A, and the large undesirable signal is 100 A at the same frequency, a circuit with a dynamic range greater than 70 db must be realized to prevent saturation of the signal chain.

It would be desirable to produce a high frequency resistance measurement instrument with a reasonable dynamic range, which militates against saturation in the presence of one or more large undesirable signals. It would be further desirable to produce a high frequency resistance instrument that can be employed at multiple induced AC currents of differing frequencies to maintain measurement capability despite signal chain saturation in the presence of a large undesirable signal.

SUMMARY OF THE INVENTION

According to the present invention, a high frequency resistance measurement instrument with a reasonable dynamic range, capable of employing multiple alternating currents of differing frequencies to maintain measurement capability despite signal chain saturation in the presence of a large undesirable signal has surprisingly been discovered.

In one embodiment, the method for measurement of high frequency resistance in a fuel cell system includes the steps of providing a fuel cell stack, providing a microcontroller, inducing at least one excitation signal into the fuel cell stack, determining the presence of undesirable signals in the fuel cell stack using the microcontroller, and determining the high frequency resistance as a function of the excitation signal at frequencies with acceptable undesirable signal levels.

In another embodiment, the method for measurement of high frequency resistance in a fuel cell system includes the steps of providing a fuel cell stack, providing a microcontroller, providing a plurality of channels wherein the total number of channels is at least one greater than the total number of expected undesirable signals, tuning each channel at a separate fixed frequency, determining a number of states, designating at least one channel as an inactive channel and the remaining channels as active channels during each state, inducing at least one excitation signal into the fuel cell stack at the frequencies of the active channels during each state, sampling an output of the channels using the microcontroller, evaluating the validity of the output, computing a high frequency resistance value of the fuel cell system, and outputting the high frequency resistance value.

In another embodiment, the apparatus for measuring high frequency resistance in a fuel cell system includes a microcontroller, at least one channel electronically linked to the microcontroller, and a frequency tuning device electronically linked to each channel.

DETAILED DESCRIPTION OF THE PREFERRED EMBODIMENT

The following detailed description and appended drawings describe and illustrate various exemplary embodiments of the invention. The description and drawings serve to enable one skilled in the art to make and use the invention, and are not intended to limit the scope of the invention in any manner. In respect of the methods disclosed, the steps presented are exemplary in nature, and thus, the order of the steps is not necessary or critical.

Figure 1:
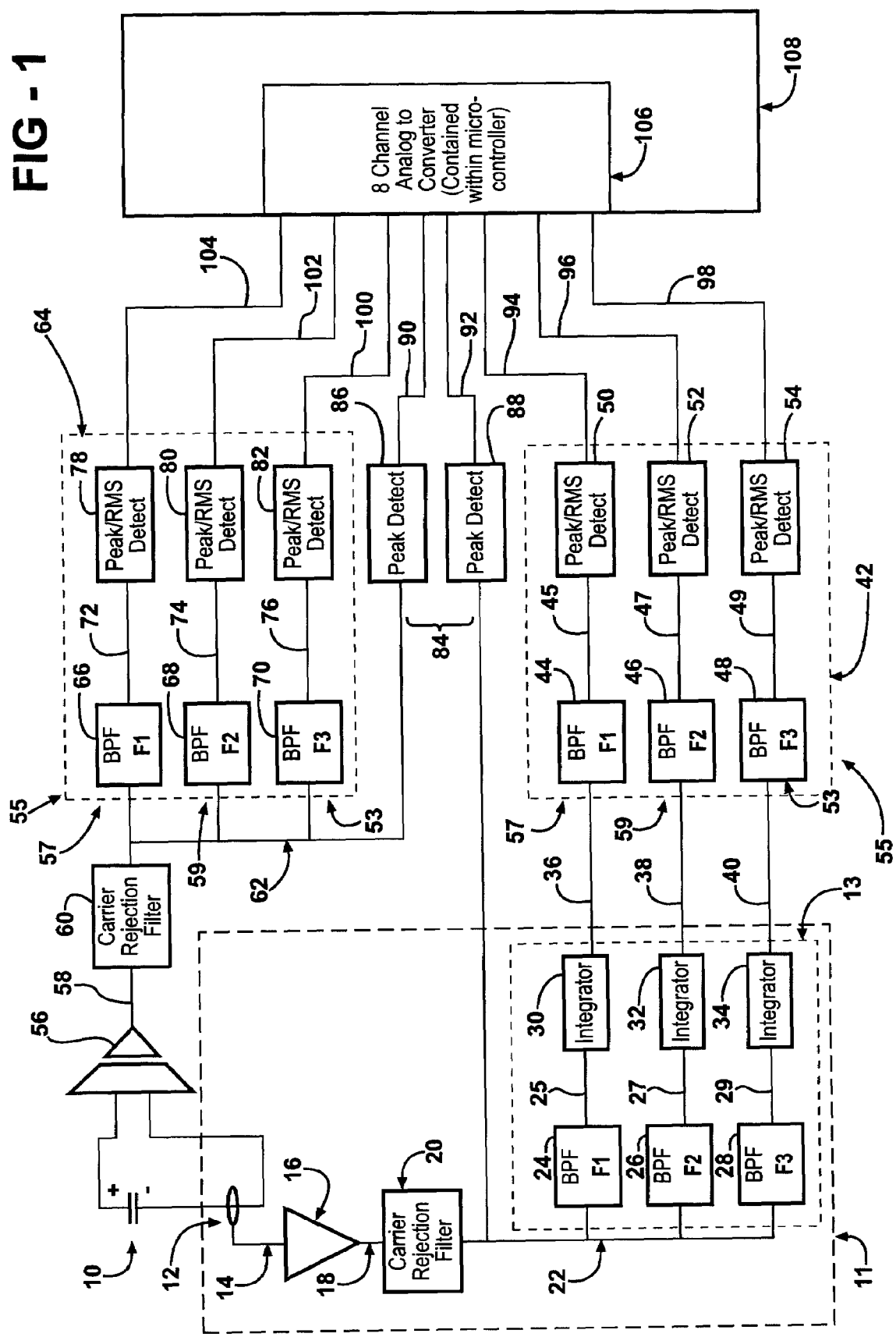
FIG. 1 is a schematic diagram of an apparatus for measurement of fuel cell high frequency resistance according to an embodiment of the invention.

FIG. 1 shows a fuel cell stack 10 consisting of a plurality of individual fuel cells which are connected electrically in series and/or in parallel. The operation of various types of fuel cell systems are commonly known in the art; one embodiment can be found in commonly owned U.S. Pat. No. 6,849,352; hereby incorporated herein by reference in its entirety. Therefore, only the operation of a fuel cell system as pertinent to this invention will be explained in the description.

In the embodiment shown herein, a high frequency resistance measurement system contains a total number of (N+1) high frequency measurement channels 55. Where N is the number of separate undesirable signals the designer expects to encounter. In FIG. 1, N is assumed to equal two, although it is understood that more or fewer signals may be present. Each high frequency measurement channel 55 contains a separate current signal chain 42 and a voltage signal chain 64. Additionally, the number of channels provided may differ without departing from the scope of the invention.

An AC current sensor 11 includes a current transducer 12 that is linked to the fuel cell stack 10. An amplifier 16 is linked to the current transducer 12 via an electrical connection 14. The electrical connections may be any conventional means of electrical connection such as insulated wire, for example. A carrier rejection filter 20 is linked to the amplifier 16 via an electrical connection 18.

The carrier rejection filter 20 is linked to a peak detector 88 in a common saturation detection circuit 84 via an electrical connection 22.

The carrier rejection filter 20 is linked to the first integrator filter 24, a second integrator filter 26, and a third integrator filter 28 via the electrical connection 22. The first integrator filter 24 is linked to the first integrator circuit 30 via an electrical connection 25 in a first high frequency resistance measurement channel 57. The second integrator filter 26 is linked to an integrator circuit 32 via an electrical connection 27 in a second high frequency resistance measurement channel 59. The third integrator filter 28 is linked to an integrator circuit 34 via an electrical connection 29 in a third high frequency resistance measurement channel 53. The integrator filters 24, 26, and 28 have tuning frequencies matching those in the high frequency measurement channels 53, 59, and 57.

A filter 44 is linked to the integrator circuit 30 via an electrical connection 36 in the current signal chain 42 for the first high frequency resistance measurement channel 57. An electrical connection 45 links the filter 44 to a detection circuit 50. The integrator circuit 32 is linked to a filter 46 via an electrical connection 38 in the current signal chain 42 for the second high frequency resistance measurement channel 59. A detection circuit 52 is linked to the filter 46 via an electrical connection 47. The integrator circuit 34 is linked to a filter 48 via an electrical connection 40 in the current signal chain 42 for the third high frequency resistance measurement channel 53. An electrical connection 49 links the filter 48 to a detection circuit 54.

An analog to digital converter 106 is linked to the detection circuit 50 via an electrical connection 94. Electrically linked to the analog to digital converter 106 is the detection circuit 52 via an electrical connection 96. The detection circuit 54 is linked to the analog digital converter 106 via an electrical connection 98. The analog to digital converter 106 is included in a microcontroller 108.

The fuel cell stack 10 is electrically connected to a safety isolation barrier circuit 56. The safety isolation barrier circuit 56 is electrically linked to a carrier rejection filter 60 via an electrical connection 58. The carrier rejection filter 60 is linked to a peak detector 86 in the common saturation detection circuit 84 via an electrical connection 62. The detectors 86 and 88 are linked to the converter 106 via electrical connections 90 and 92 respectively.

The carrier rejection filter 60 is linked to a filter 66 in the voltage signal chain 64 for the first high frequency resistance measurement channel 57. The carrier rejection filter 60 is linked to a filter 68 in the voltage signal chain 64 for the second high frequency resistance measurement channel 59. The carrier rejection filter 60 is linked to a filter 70 in the voltage signal chain 64 for the third high frequency resistance measurement channel 53.

An electrical connection 72 links the filter 66 to a detection circuit 78. The filter 68 is linked to a detection circuit 80 via an electrical connection 74. An electrical connection 76 links the filter 70 to a detection circuit 82.

The detection circuits 78, 80 and 82 are linked to the analog to digital converter 106 via electrical connections 104, 102 and 100 respectively.

In operation, the fuel cell stack 10 generates electrical current and voltage in a manner commonly known the art. An excitation signal, containing a ripple current and causing a ripple voltage, is induced in the fuel cell stack 10. The excitation signal is generated using the fuel cell stack 10 end cell heaters (not shown). The output of the end cell heaters is regulated using pulse-width-modulation. The frequency of the ripple current is varied by controlling the carrier frequency of the pulse-width-modulation. Additionally, other sources of inducing the excitation signal may be used without departing from the scope of the invention.

The alternating current sensor 11 measures the alternating current flow through the fuel cell stack 10 via the current transducer 12. The current transducer 12 converts the magnitude of the current into a voltage signal which is proportional to the flow of the current through the fuel cell stack 10. The voltage signal is amplified by the amplifier 16, and filtered by the carrier rejection filter 20.

Some current transducers 12 require an integrator circuit 13, which may saturate in the presence of large undesirable signals. Therefore, the alternating current sensor integrator 11 may include the separate integrator filters 24, 26, 28 for each high frequency measurement channel 55. The integrator filters 24, 26, 28 are tuned to frequencies matching those of the individual high frequency measurement channels 55.

The high frequency measurement channels 55 include the filters 44, 46, 48 on the current signal chain 42 and the filters 66, 68, 70 on the voltage signal chain 64 tuned to corresponding frequencies. The frequencies of interest of each high frequency measurement channel 55 are tuned to avoid known fixed-frequency undesirable signals. The filters 44, 46, 48, 66, 68, 70 limit the exposure of each individual voltage signal chain 64 and current signal chain 42 to nearby large undesirable signals, while allowing saturation of a high frequency measurement channel 55 whose tuning frequency coincides with the frequency of a large undesirable signal. When a large undesirable signal is present and causing one high frequency measurement channel 55 to saturate, the filters on the adjacent high frequency measurement channel 55 attenuate the undesirable signal sufficiently that the induced ripple current can be recovered without saturation. Additionally, it is understood that various types of frequency tuning devices known in the art can be used without departing from the scope of the invention.

The current signal chains 42 receive the voltage signal from the alternating current sensor 11 and are the current measurement and conditioning portion of the high frequency measurement channels 55. The current signal chains 42 measure the current at a predetermined frequency tuned by the filters 44, 46, 48 via the detection circuits 50, 52, 54. The current signal chains 42 also condition the measurement as an output signal to the microcontroller 108.

The safety isolation barrier circuit 56 is used in the high frequency measurement apparatus if the voltage generated across the fuel cell stack 10 is sufficient to be dangerous to persons or connected equipment. The safety isolation barrier circuit 56 provides galvanic isolation between high voltage and low voltage portions of the system. The carrier rejection filter 60 filters the frequencies of interest from the voltage received from the fuel cell stack 10 via the safety isolation barrier circuit 56.

The voltage signal chains 64 receive the voltage signal from the carrier rejection filter 60 and are the voltage measurement and conditioning portion of the high frequency measurement channels 55. The voltage signal chains 64 measure the voltage at a predetermined frequency tuned by the filters 66, 68, 70 via the detection circuits 78, 80, 82. The voltage signal chains also condition the measurement as an output signal.

Figure 2:
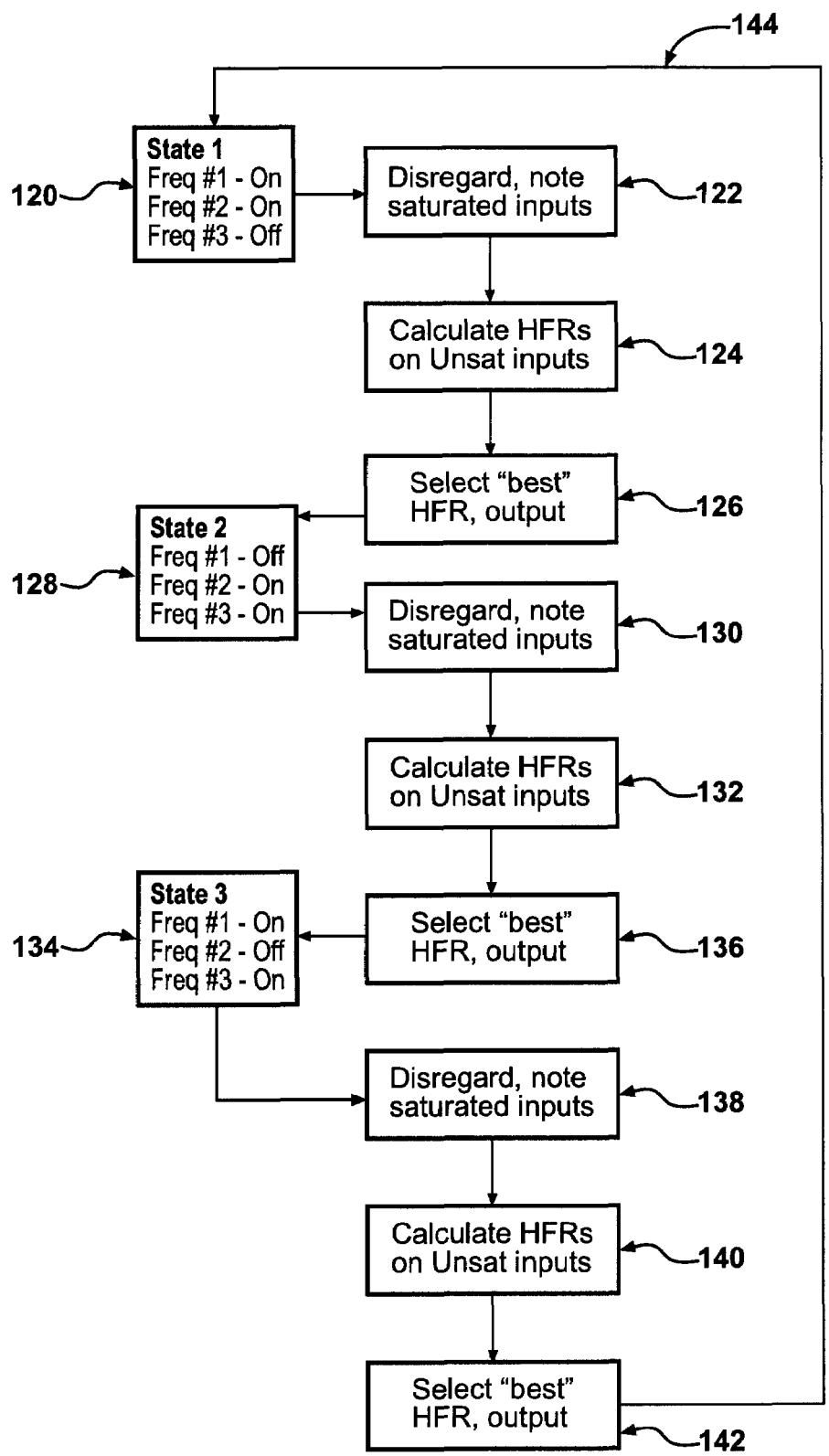
FIG. 2 is a flow diagram illustrating a method of controlling the apparatus for measurement of fuel cell high frequency resistance of FIG. 1.

Referring now to FIG. 2, the microcontroller 108 operates as a state machine to augment the selection of the most-accurate high frequency measurement value. The microcontroller 108 continuously samples the outputs of each high frequency measurement channel 55 of the voltage signal chain 64 and the current signal chain 42. The number of states implemented depends on the total number of high frequency measurement channels 55 and the total number of high frequency measurement channels 55 which can be excited simultaneously.

In each state 120, 128, 134 excitation signals are injected in the fuel cell stack 10 at all but one of the high frequency measurement channels 55 frequencies. The high frequency measurement channels 55 in which current ripples are excited are designated as active channels, and the other channels are designated as inactive channels.

The microcontroller 108 evaluates the validity of each voltage and current ripple measurement on each active channel, to determine if a large undesirable signal is causing the high frequency measurement channel sensor to saturate in steps 122, 130, and 138. If the microcontroller 108 does not detect saturation, the high frequency measurement value for the high frequency measurement channel is computed in steps 124, 132, and 140 and the microcontroller selects the best measurement to output as an electrical signal in steps 126, 136, and 142. The microcontroller also checks the unexcited channels for the presence of any voltage or current in the absence of intentional excitation. Measurements taken on channels with less unexcited ripple are considered more valid in measurements taken in subsequent states. High frequency measurement channels exhibiting saturation or high levels of unexcited ripple are considered less-valid in subsequent states. The microcontroller 108 may output a single or multiple high frequency measurements in each state depending on the validity algorithm. The microcontroller 108 may also output the frequency at which the high frequency output measurements were taken. The microcontroller 108 returns to the first state 120 after cycling through all the states 144.

Figure 3:
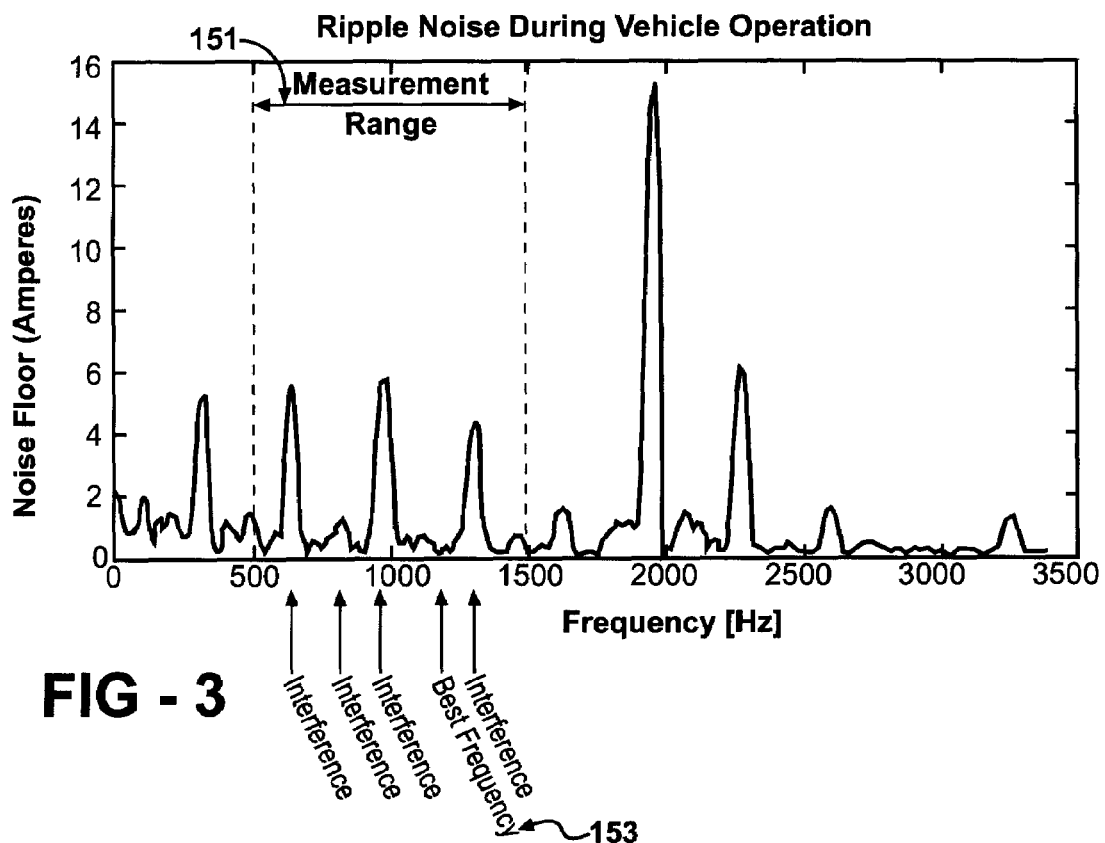
FIG. 3 is a graph showing a plot of noise floor v. frequency during operation of a vehicle and illustrating ripple noise during operation of the vehicle.
Figure 4:
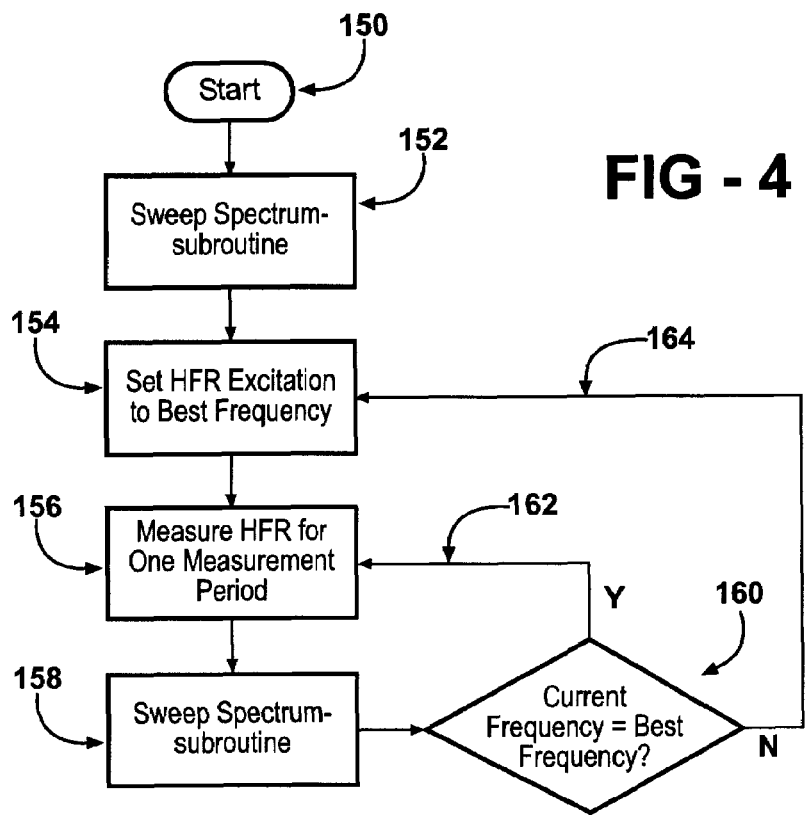
FIG. 4 is a flow diagram illustrating a method of controlling an apparatus for measurement of fuel cell high frequency resistance according to another embodiment of the invention.
Figure 5:
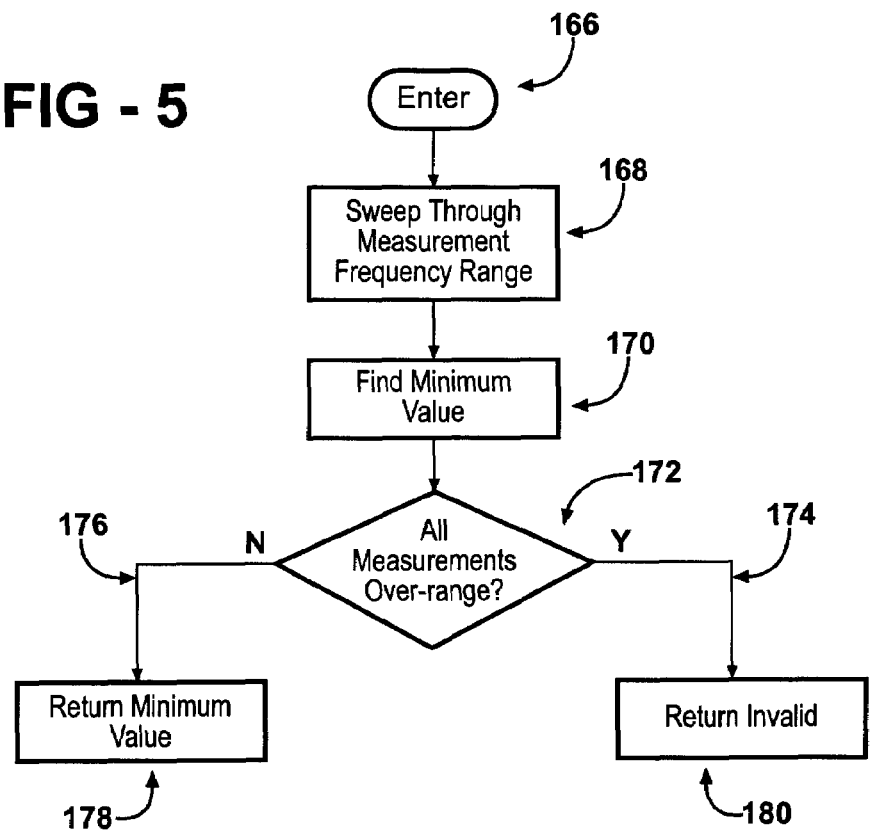
FIG. 5 is a flow diagram illustrating a subroutine for the method of controlling the apparatus for measurement of fuel cell high frequency resistance of FIG. 4.

In another embodiment, the high frequency measurement apparatus is realized using at least one of the high frequency measurement channels 55. The microcontroller 108 continuously scans through a predetermined measurement range 151 as shown in FIG. 3 for a desired frequency 153. As shown in FIG. 5, the microcontroller 108 scans from an Enter 166 with a first measurement channel at 168 until locating a frequency where the level of unexcited ripple is minimal and no saturating undesirable signals exist 170. If the microcontroller 108 has scanned all measurements without finding a minimum value (Y at 172) then it branches at 174 and an invalid signal is returned 180. If the microcontroller 108 has not scanned all measurements without finding a minimum value (N at 172) it branches at 176 and then the minimum value is returned 178. In FIG. 4, from a Start 150 the subroutine of FIG. 5 is run in step 152 and the high frequency resistance excitation is set to the desired frequency 153 in a step 154 determined by the minimum value returned 178. The microcontroller 108 measures the high frequency resistance for one measurement channel at the desired frequency 153 at 156. The microcontroller 108 can measure the high frequency resistance at the desired frequency 153 using the first high frequency measurement channel or a second high frequency measurement channel. The subroutine of FIG. 5 is run in the step 158 and the current frequency is compared with the best frequency at 160. The method branches at 162 to step 156 if the current frequency is the best frequency (Y at 160) and branches at 164 to step 154 if not (N at 160).

Figure 6:
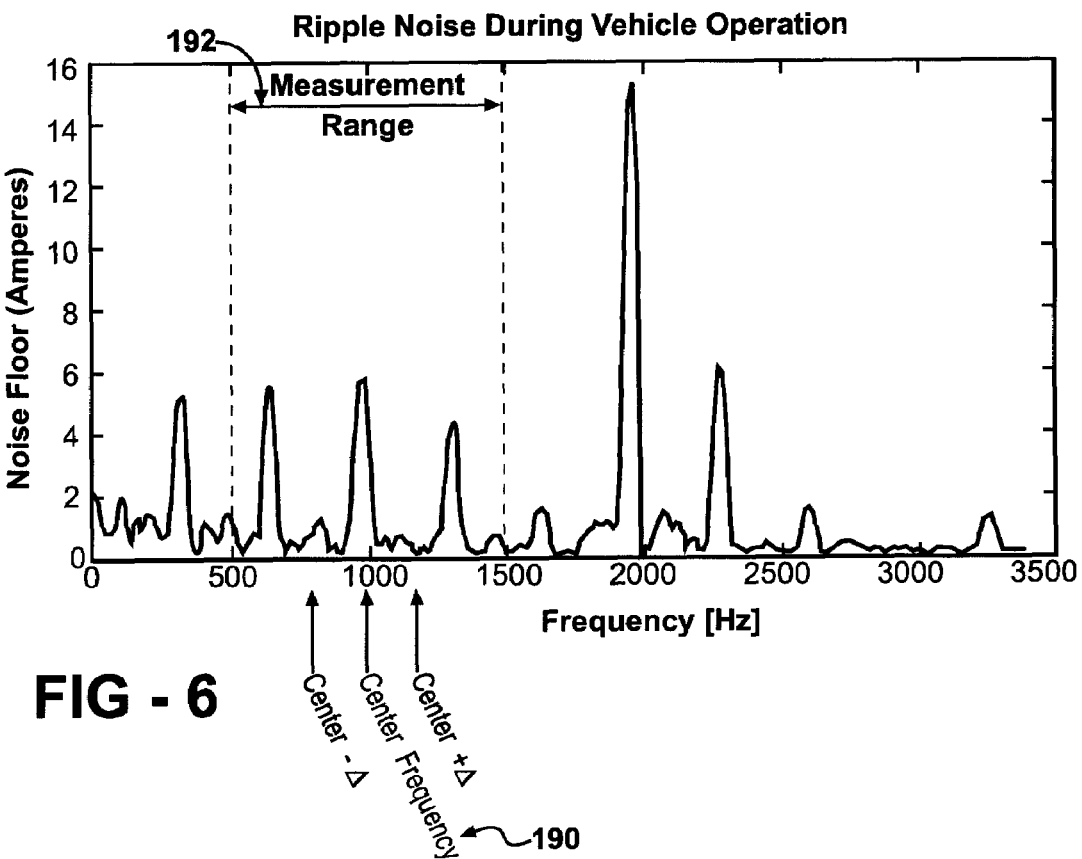
FIG. 6 is a graph showing a plot of noise floor v. frequency during operation of a vehicle and illustrating ripple noise during operation of the vehicle for a third embodiment of the invention.
Figure 7:
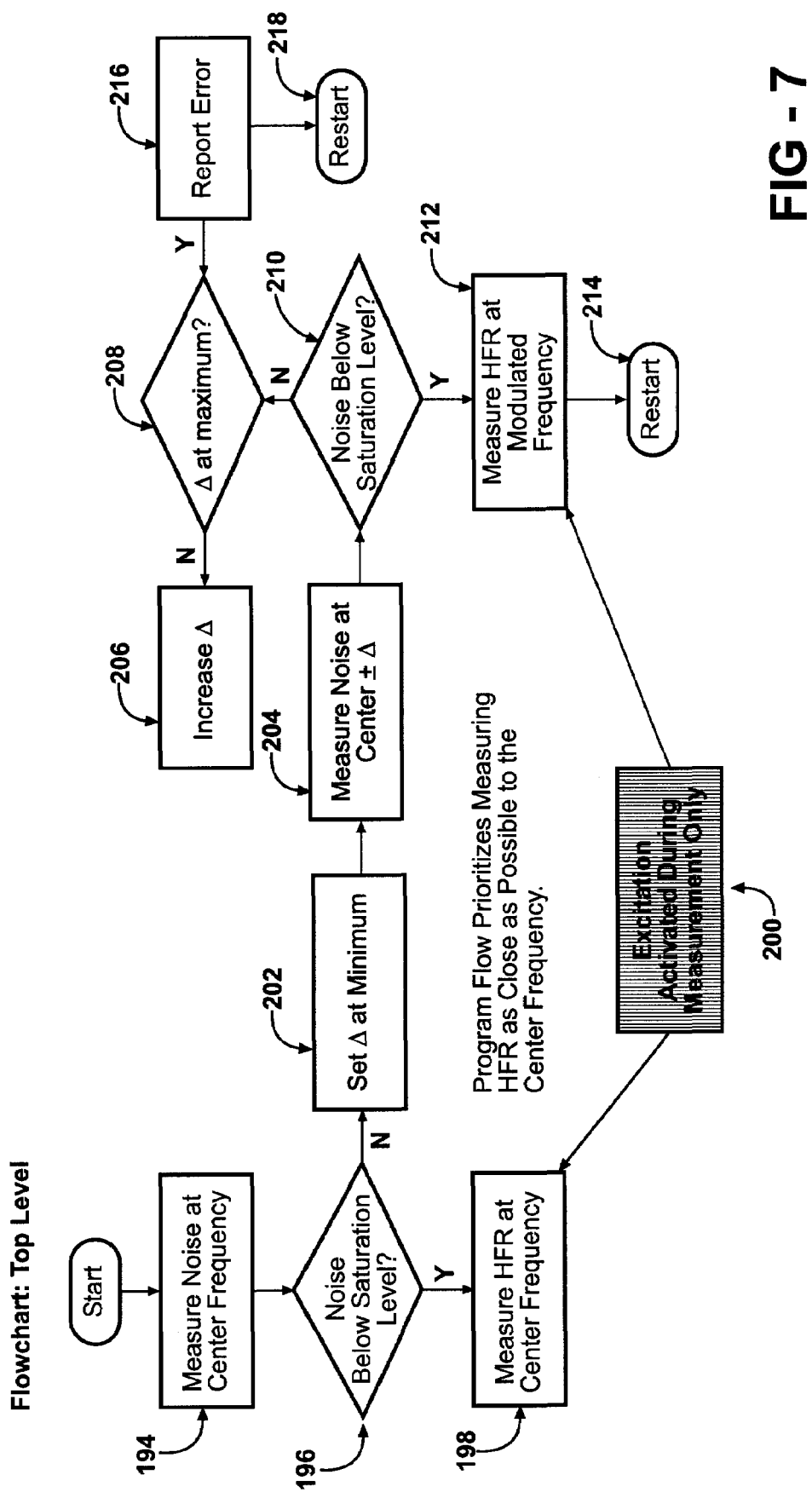
FIG. 7 is a flow diagram illustrating a method of controlling an apparatus for measurement of fuel cell high frequency resistance according to the third embodiment of the invention.

In another embodiment the high frequency measurement apparatus is realized using a single high frequency measurement channel 55 located at a center frequency 190 in a predetermined measurement range 192 as shown in FIG. 6. The microcontroller 108 measures the noise at the center frequency 190 at a step 194 in FIG. 7. The microcontroller 108 measures the high frequency resistance at the center frequency 190 in a step 198 if the noise level is below saturation (Y at 196).

If noise at the center frequency is not below saturation level (N at 196), the microcontroller 108 modulates the frequency of the high frequency measurement channel 55 an even modulation distance $\Delta$ above and below the center frequency 190. The modulation distance is set at a minimum in a step 202, and the microcontroller 108 measures the noise at the center frequency 190 plus and minus the modulation distance $\Delta$ at 204. The microcontroller increases the modulation distance $\Delta$ in a step 206 when the modulation distance is not already at the maximum (N at 208). If the modulation distance is at the maximum the system reports an error in a step 216 and restarts in a step 218.

The high frequency measurement apparatus induces the excitation signal and measures the high frequency resistance at the modulated frequency in a step 212 when the noise is below saturation (Y at 210), and then restarts at 214. A step 200 activates the excitation during measurement only.

From the foregoing description, one ordinarily skilled in the art can easily ascertain the essential characteristics of this invention and, without departing from the spirit and scope thereof, make various changes and modifications to the invention to adapt it to various usages and conditions.

What is claimed is:

1. A method for measurement of high frequency resistance in a fuel cell system, comprising the steps of:
 (a). providing a fuel cell stack;
 (b). providing a microcontroller;
 (c). inducing at least one excitation signal into the fuel cell stack;
 (d). tuning a first high frequency measurement channel to a center frequency;
 (e). modulating a frequency of the first high frequency measurement channel to minimize exposure to an undesirable signal when noise at the center frequency causes saturation of the first high frequency measurement channel;

(f). measuring undesirable signal levels in the first high frequency measurement channel using the microcontroller; and (g). calculating the high frequency resistance as a function of the at least one excitation signal at a frequency with acceptable measured undesirable signal levels.

2. The method according to claim 1, further comprising the step of increasing a modulation distance from the center frequency until exposure to the undesirable signal is minimized.

3. The method according to claim 1, further comprising the step of inducing the excitation signal into the fuel cell at the frequency being modulated.

4. A method for measurement of high frequency resistance in a fuel cell system, comprising the steps of:
   providing a fuel cell stack;
   providing a microcontroller;
   providing a plurality of high frequency measurement channels wherein the total number of channels is at least one greater than the total number of expected undesirable signals;
   tuning each high frequency measurement channel at a separate fixed frequency;
   determining a number of states implemented by the microcontroller;
   designating at least one high frequency measurement channel as an inactive channel and the remaining high frequency measurement channels as active channels during each state;
   inducing at least one excitation signal into the fuel cell stack at the frequencies of the active channels during each state;
   sampling an output of the high frequency measurement channels using the microcontroller;
   evaluating a validity of the sampled output;
   computing a high frequency resistance value from at least one of the plurality of high frequency measurement channels having a valid sampled output; and
   outputting at least one of the computed the high frequency resistance value.

5. The method according to claim 4, including performing said step (d) by tuning the independent signal chains to minimize exposure to known fixed-frequency undesirable signals.

6. The method according to claim 4, including performing said step (h) by using the microcontroller to evaluate the unexcited channels for voltage or current ripples in the absence of an intentional excitation signal.

7. The method according to claim 4, further including the step of outputting the frequency at which the high frequency resistance value was computed.

8. An apparatus for measuring high frequency resistance in a fuel cell system, comprising:
   a high frequency voltage measurement channel tuned to a predetermined frequency, thereby minimizing exposure to an undesirable signal at a frequency that would cause the high frequency voltage measurement channel to saturate, the high frequency voltage measurement channel responsive to an excitation signal injected into the fuel cell system for generating a voltage signal;
   a high frequency current measurement channel tuned to said predetermined frequency, thereby minimizing exposure to an undesirable signal at a frequency that would cause the high frequency current measurement channel to saturate, the high frequency current measurement channel responsive to said excitation signal injected into the fuel cell system for generating a current signal; and
   a microcontroller responsive to said voltage signal and said current signal for calculating a high frequency resistance value.

9. The apparatus according to claim 8, wherein the predetermined frequency is adjustable by said microcontroller.

10. The apparatus according to claim 8, wherein a first number of said high frequency voltage measurement channels is at least one greater than a second number of expected undesirable signals.

11. The apparatus according to claim 10, including said first number of high frequency current measurement channels.

\* \* \* \* \*